(12) United States Patent
Suzuki

(10) Patent No.: US 12,469,816 B2
(45) Date of Patent: Nov. 11, 2025

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takeyuki Suzuki, Kaga Ishikawa (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 587 days.

(21) Appl. No.: 17/902,535

(22) Filed: Sep. 2, 2022

(65) Prior Publication Data

US 2023/0317672 A1    Oct. 5, 2023

(30) Foreign Application Priority Data

Mar. 22, 2022    (JP) .................. 2022-045800

(51) Int. Cl.
*H01L 23/00* (2006.01)
*H01L 23/495* (2006.01)

(52) U.S. Cl.
CPC ........ *H01L 24/37* (2013.01); *H01L 23/49562* (2013.01); *H01L 24/32* (2013.01);
(Continued)

(58) Field of Classification Search
CPC ... H01L 24/84; H01L 24/37; H01L 23/49513; H01L 24/32; H01L 23/49562;
(Continued)

(56) References Cited

U.S. PATENT DOCUMENTS 5,866,818 A * 2/1999 Sumi ................ G01P 15/08
73/514.36
7,432,594 B2 10/2008 Ashida et al.
(Continued)

FOREIGN PATENT DOCUMENTS

JP    2004111745 A    4/2004
JP       4468115 B2    5/2010
(Continued)

OTHER PUBLICATIONS

Notice of Reasons for Refusal (Office Action) mailed Apr. 1, 2025 in corresponding Japanese Patent Application No. 2022-045800 with English machine translation, 7 pages.

*Primary Examiner* — Mouloucoulaye Inoussa
(74) *Attorney, Agent, or Firm* — Kim & Stewart LLP

(57) ABSTRACT

A semiconductor device includes: a first connector including a first plate having a first upper surface and a first terminal connected to the first plate, a first plate including a second plate and a third plate, a plate thickness of the second plate being thinner than a plate thickness of the third plate, the third plate being provided between the second plate and the first terminal; a semiconductor chip provided on the first upper surface; a first bonding material provided between the first upper surface and the semiconductor chip; a second connector provided on the semiconductor chip, a third connector, the first plate being provided between the first terminal and the third connector; a second bonding material provided between the second connector and the semiconductor chip; and a third bonding material provided between the second connector and the third connector.

17 Claims, 6 Drawing Sheets

(52) U.S. Cl.
CPC .............. *H01L 24/83* (2013.01); *H01L 24/84* (2013.01); *H01L 2224/32014* (2013.01); *H01L 2224/37005* (2013.01); *H01L 2224/83801* (2013.01); *H01L 2224/84359* (2013.01); *H01L 2924/13055* (2013.01); *H01L 2924/13091* (2013.01)

(58) Field of Classification Search
CPC ... H01L 23/49524; H01L 24/83; H01L 24/40; H01L 2924/13091; H01L 2224/37005; H01L 2924/13055; H01L 2224/84359; H01L 2224/32014; H01L 2224/83801; H01L 2224/371; H01L 2924/01082; H01L 2924/01005; H01L 2224/84345; H01L 2924/01006; H01L 2924/01004; H01L 2224/32245; H01L 2924/30105
See application file for complete search history.

(56) References Cited

U.S. PATENT DOCUMENTS

| | | |
|---|---|---|
| 10,340,347 B1 | 7/2019 | Yoshida et al. |
| 2004/0056362 A1* | 3/2004 | Moriguchi ............... H01L 24/40 257/784 |
| 2004/0103530 A1* | 6/2004 | Adachi ............... G01R 33/0206 361/813 |
| 2005/0056927 A1* | 3/2005 | Teshima ................ H01L 24/33 257/E23.092 |
| 2006/0053909 A1* | 3/2006 | Shirasaka ............... G01P 15/18 29/595 |
| 2007/0064429 A1* | 3/2007 | Mazzochette ............. G09F 9/33 257/E33.072 |
| 2007/0184584 A1* | 8/2007 | Shirasaka ......... H01L 23/49503 257/E23.037 |
| 2007/0217476 A1* | 9/2007 | Yoshikawa ........... H01S 5/0237 372/66 |
| 2010/0075465 A1* | 3/2010 | Chew ...................... H01L 21/56 257/E21.502 |
| 2012/0007236 A1* | 1/2012 | Bae ....................... H01L 23/498 257/737 |
| 2014/0015072 A1* | 1/2014 | Kang .................... H10D 48/50 438/51 |
| 2015/0262917 A1 | 9/2015 | Fukui |
| 2016/0204047 A1 | 7/2016 | Sugiura et al. |
| 2016/0293804 A1* | 10/2016 | Haslbeck ............. H10H 20/857 |
| 2019/0043788 A1* | 2/2019 | Iwai ................. H01L 23/49551 |
| 2019/0080979 A1* | 3/2019 | Tonedachi ............. H01L 24/32 |
| 2020/0168575 A1* | 5/2020 | Bemmerl .............. H01L 24/83 |
| 2021/0043816 A1* | 2/2021 | Bower .................... H01L 24/13 |
| 2021/0225743 A1* | 7/2021 | Oogushi ............... H01L 23/053 |

FOREIGN PATENT DOCUMENTS

| | | |
|---|---|---|
| JP | 2012099559 A | 5/2012 |
| JP | 2015-012065 A | 1/2015 |
| JP | 6447946 B1 | 1/2019 |
| JP | 2019-087613 A | 6/2019 |
| JP | 2019186431 A | 10/2019 |
| JP | 2020184578 A | 11/2020 |
| JP | 2021-034615 A | 3/2021 |

* cited by examiner

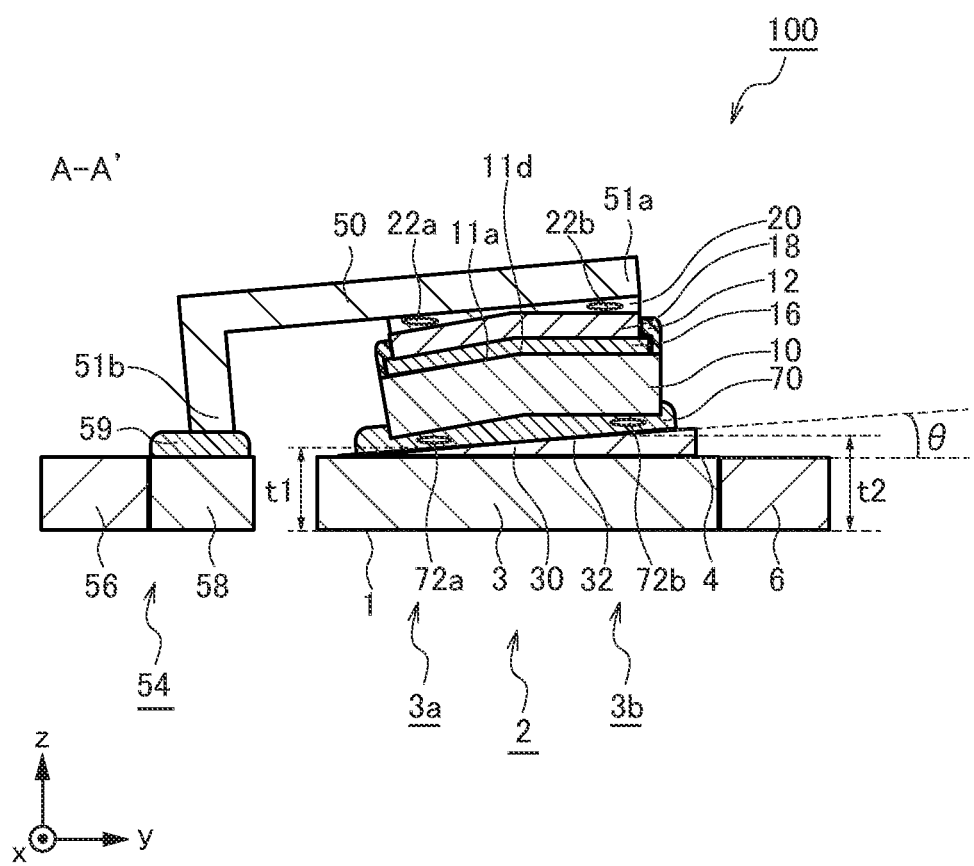

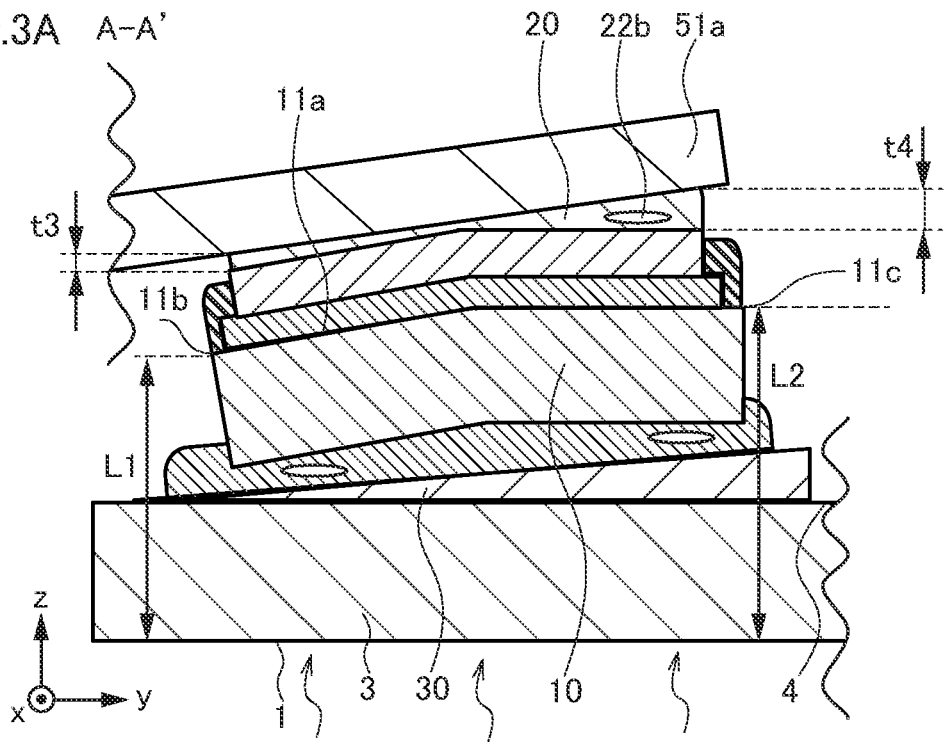
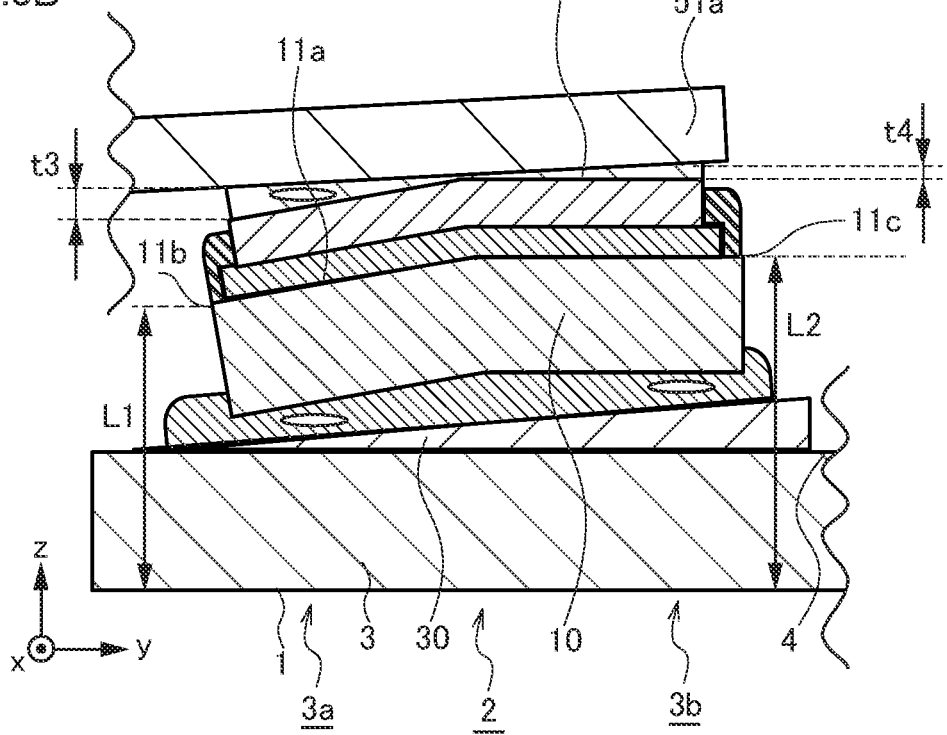

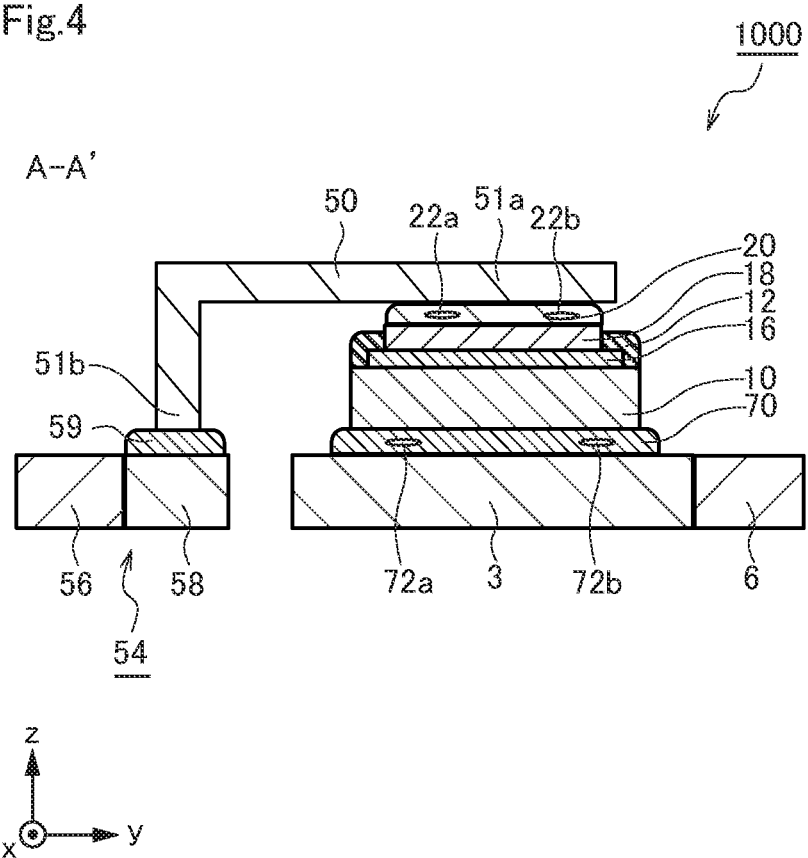

SEMICONDUCTOR DEVICE

CROSS-REFERENCE TO RELATED APPLICATION

This application is based upon and claims the benefit of priority from Japanese Patent Application No. 2022-045800, filed on Mar. 22, 2022, the entire contents of which are incorporated herein by reference.

FIELD

Embodiments described herein relate generally to semiconductor device.

BACKGROUND

A semiconductor device having a semiconductor chip such as a metal oxide semiconductor field effect transistor (MOSFET) is used for applications such as power conversion. For example, when semiconductor device described above is a vertical MOSFET, a source electrode provided on an upper surface of a semiconductor chip is connected to a connector provided on MOSFET, for example.

BRIEF DESCRIPTION OF THE DRAWINGS

FIG. 2 is a schematic cross-sectional view of the semiconductor device according to the embodiment;

FIGS. 3A-3B are schematic cross-sectional views of main portions of the semiconductor device according to the embodiment;

FIG. 4 is a schematic sectional view of a semiconductor device as a first comparative embodiment of the embodiment;

DETAILED DESCRIPTION

Figure 1:
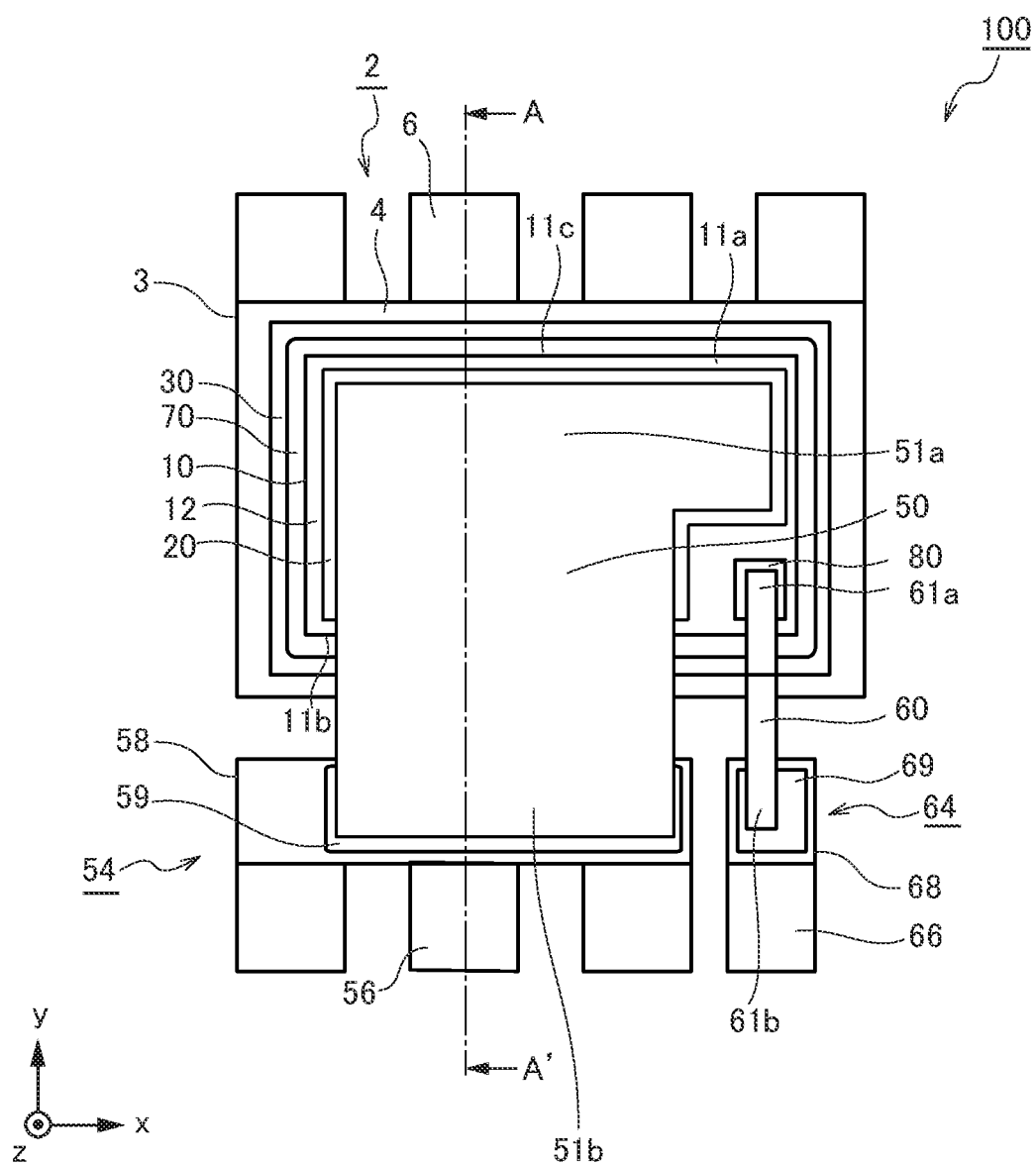
FIG. 1 is a schematic top view of a semiconductor device according to an embodiment.

Hereinafter, embodiments of the present disclosure will be described with reference to the drawings. Note that in the following description, the same members and the like are denoted by the same reference numerals, and description of members and the like once described is appropriately omitted.

In this specification, in order to illustrate the positional relationship of parts and the like, the upward direction of the drawings may be referred to as "upper", and the downward direction of the drawings may be referred to as "lower". Here, the terms "up" and "down" do not necessarily indicate a relationship with the direction of gravity.

Embodiment

A semiconductor device of embodiments includes: a first connector including a first plate having a first upper surface and a first terminal connected to the first plate, a first plate including a second plate and a third plate, a plate thickness of the second plate being thinner than a plate thickness of the third plate, the third plate being provided between the second plate and the first terminal; a semiconductor chip provided on the first upper surface; a first bonding material provided between the first upper surface and the semiconductor chip; a second connector provided on the semiconductor chip, a third connector, the first plate being provided between the first terminal and the third connector; a second bonding material provided between the second connector and the semiconductor chip; and a third bonding material provided between the second connector and the third connector.

FIG. 1 is a schematic top view of a semiconductor device 100 according to the embodiment. FIG. 2 is a schematic cross-sectional view of the semiconductor device 100 of the embodiment. FIG. 2 is a schematic view of a cross section taken along line A-A' in FIG. 1.

With reference to FIGS. 1 and 2, the semiconductor device 100 of the embodiment is explained.

A drain connector (die pad, an example of the first connector) 2 is a member containing a conductive material such as Cu (copper), and a semiconductor chip 10 is disposed on the drain connector 2. The drain connector 2 has a first plate (an example of a plate) 3 and drain terminals (the drain terminal is an example of a first terminal) 6. The first plate 3 has a bottom surface 1 and a first upper surface 4. The drain terminal 6 is connected to the first plate 3. The drain terminal 6 is used to connect the semiconductor chip 10 and an external circuit (not shown).

Here, an X direction, a Y direction perpendicular to the X direction, and a Z direction perpendicular to the X direction and the Y direction are defined. The bottom surface 1 and the first upper surface 4 are disposed parallel to the XY plane. The drain terminal 6 is provided on the Y-direction side of the first plate 3.

The first plate 3 has a first plate portion (an example of a second plate) 3a and a second plate portion (an example of a third plate) 3b. The second plate portion 3b is provided between the first plate portion 3a and the drain terminal 6. A film thickness $t_1$ of the first plate portion 3a of the first plate 3 is thinner than a film thickness $t_2$ of the second plate portion 3b of the first plate 3. Here, the film thickness $t_1$ and the film thickness $t_2$ are measured perpendicular to the first upper surface 4.

For example, the first upper surface 4 has a slope 30 on the first upper surface 4. The slope 30 is provided so as to be lower from the second plate portion 3b toward the first plate portion 3a. The slope 30 has a second upper surface 32.

The angle θ formed by the second upper surface 32 and the first upper surface 4 is preferably 0.2 degrees or more and 3 degrees or less. In the figure of the embodiment, in order to illustrate slope 30 easily, it is illustrated with θ greater than 3 degrees.

The semiconductor chip 10 is provided on (above) the first upper surface 4 of the drain connector 2 or on the slope 30 of the drain connector 2. The semiconductor chip 10 is, for example, a chip in which the vertical MOSFET or an IGBT (Insulated Gate Bipolar Transistor) or the like is provided on a semiconductor substrate such as a Si (silicon) substrate, an SiC (silicon carbide) substrate, a GaAs (gallium arsenide) substrate, or a GaN (gallium nitride) substrate.

As shown in FIG. 2, the semiconductor chip 10 of the embodiment has a protrusion 11d. The semiconductor chip 10 of the embodiment has a convex shape on top. In the semiconductor device 100, the protrusion 11d is disposed so as to be convex upward. In other words, the protrusion 11d has a convex shape on the second metal film (source electrode) 18 side. That is, the semiconductor chip 10 has a convex shape on the side where a second connector 50 is provided. Note that the semiconductor chip 10 which does not have an upwardly convex configuration can be preferably used in semiconductor device 100 of the embodiment.

The semiconductor chip 10 has a third upper surface 11a. The third upper surface 11a has a first side 11b and a second side 11c facing the first side 11b. When viewed from above, the first side 11b is provided between the second side 11c and the third connector 54.

A first bonding material 70 is provided between the first upper surface 4 and the semiconductor chip 10. When the first upper surface 4 has the slope 30, the first bonding material 70 is provided between the slope 30 and the semiconductor chip 10. The first bonding material 70 joins the first upper surface 4 or slope 30 and the semiconductor chip 10. For example, when the semiconductor chip 10 is provided with the MOSFET, the first bonding material 70 joins the first upper surface 4 or the slope 30 and the drain electrode (not shown) of the semiconductor chip 10.

The area of the slope 30 when viewed from above is preferably larger than the area of the semiconductor chip 10 when viewed from above.

Incidentally, the slope 30 may be provided on the entire surface on the first upper surface 4, or the slope 30 may be provided on a portion of the first upper surface 4.

The first bonding material 70 may have a void 72 in the first bonding material 70. In FIG. 2, a void 72a and a void 72b are shown.

The first metal film 16 is provided on the semiconductor chip 10. The first metal film 16 includes, for example, Al (aluminum).

An insulating film 12 is provided on the first metal film 16. For example, the insulating film 12 is provided on the end of the semiconductor chip 10 and on the end of the first metal film 16. The insulating film 12 includes insulating materials such as polyimides.

A second metal film 18 is provided on the first metal film 16. The second metal film 18 is surrounded by the insulating film 12 on the first metal film 16. The second metal film 18 includes, for example, Ni and Au.

For example, when the semiconductor chip 10 is provided with the MOSFET, the first metal film 16 and the second metal film 18 correspond to the source electrode of the MOSFET.

A third connector (an example of a first post) 54 has a second plate 58 and source terminals (the source terminal is an example of a second terminal) 56. The third connector 54 includes a conductive material such as Cu. The third connector 54 is used for connecting the semiconductor chip 10 and an external circuit (not shown). Here, the first plate 3 is provided between the drain terminal 6 and the source terminal 56. Further, the second plate 58 is, for example, provided between the source terminal 56 and the first plate 3.

A fourth connector (an example of a second post) 64 has a third plate 68 and a gate terminal 66. The fourth connector 64 includes a conductive material such as Cu. The fourth connector 64 is used for connecting the semiconductor chip 10 and an external circuit (not shown).

The second connector 50 includes a first end 51a and a second end 51b. The second connector 50 includes, for example, a conductive material such as Cu. Incidentally, the surface of the second connector 50 may be plated by a material containing, for example, Sn. The first end 51a is provided above the first metal film 16. The second end 51b is provided on the second plate 58.

A second bonding material 20 is provided on the second metal film 18. The second bonding material 20 is provided between the second metal film 18 and the first end 51a. The second bonding material 20 joins the first end 51a and the second metal film 18.

The second bonding material 20 may have a void (bubble) 22 in the second bonding material 20. In FIG. 2, a void 22a and a void 22b are shown.

The diameter of the void 22 is preferably 1 mm or less. It is further preferable that the void 22 has a diameter of 500 μm or less.

The third bonding material 59 is provided between the second plate 58 and the second end 51b. The third bonding material 59 joins the second plate 58 and the second end 51.

The fifth connector 60 has a third end 61a and a fourth end 61b. The fifth connector 60 includes, for example, a conductive material such as Cu. Incidentally, the surface of the fifth connector 60 may be plated by a material containing, for example, Sn. The third end 61a is electrically connected to the semiconductor chip 10 via a fourth bonding material 80 provided on the semiconductor chip 10. Below the fourth bonding material 80, for example, a gate electrode (not shown) of the semiconductor chip 10 is provided.

The fifth bonding material 69 is provided between the third plate 68 and the fourth end 61b. The fifth bonding material 69 joins the third plate 68 and the fourth end 61b.

When the semiconductor chip 10 has the protrusion 11d, the film thickness of the first bonding material 70 near the center of the semiconductor chip 10 is thick. On the other hand, the film thickness of the first bonding material 70 near the end of the semiconductor chip 10 is thin. Here, the film thickness of the first bonding material 70 is measured perpendicular to the first upper surface 4.

When the semiconductor chip 10 has the protrusion 11d, the film thickness of the second bonding material 20 near the center of the semiconductor chip 10 is thin. On the other hand, the film thickness of the second bonding material 20 near the end of semiconductor chip 10 is thick. Here, the film thickness of the second bonding material is measured perpendicular to the first upper surface 4.

As the first bonding material 70, the second bonding material 20, the third bonding material 59, the fourth bonding material 80, and the fifth bonding material 69, for example, solder containing Pb (lead) and Sn (tin), solder containing Pb, Ag (silver), and Sn (tin), solder containing Sn and Sb (antimony), solder containing Au (gold) and Sn, solder containing Au and Si, or solder containing Au and Ge (germanium) can be preferably used.

FIGS. 3A-B are schematic cross-sectional views of main portions of the semiconductor device according to the embodiment.

As shown in FIGS. 3A-B, the distance $L_1$ between the first side 11b and the bottom surface 1 is shorter than the distance $L_2$ between the second side 11c and the bottom surface 1.

FIG. 3A shows that a film thickness $t_3$ of the second bonding material 20 in the vicinity of the first side 11b is thinner than a film thickness $t_4$ of the second bonding material 20 in the vicinity of the second side 11c. FIG. 3B shows that the film thickness $t_3$ of the second bonding material 20 in the vicinity of the first side 11b is thicker than the film thickness $t_4$ of the second bonding material 20 in the vicinity of the second side 11c. Both cases above can be preferably used as the semiconductor device 100 of the embodiment. Here, the film thickness $t_3$ and the film thickness $t_4$ are measured perpendicular to the first upper surface 4.

The manufacturing method of the semiconductor device 100 of the embodiment is described. First, the drain connector 2, the third connector 54, and the fourth connector 64 are disposed on the reflow plate. Then, a cream solder to be the first bonding material 70 is applied on the drain connector 2. Next, the semiconductor chip 10 is disposed on the cream solder to be the first bonding material 70. Next, on the semiconductor chip 10, a creamed solder to be the second bonding material 20 is applied. Next, on the second plate 58 of the third connector 54, a cream solder to be the third bonding material 59 is applied. Next, on the gate electrode of the semiconductor chip 10, a cream solder to be the fourth bonding material 80 is applied. Next, on the third plate 68 of the fourth connector 64, a cream solder to be the fifth bonding material 69 is applied. Next, the first end 51a of the second connector 50 is disposed on the cream solder to be second bonding material 20. Next, the second end 51b of the second connector 50 is disposed on the cream solder to be the third bonding material 59. Next, the third end 61a of the fifth connector 60 is disposed on the cream solder to be the fourth bonding material 80. Next, the fourth end 61b of the fifth connector 60 is disposed on the cream solder to be the fifth bonding material 69. Next, the cream solders are heated by a vacuum reflow heat treatment and melted. Next, the cream solders are solidified by cooling. Thus, the first bonding material 70, the second bonding material 20, the third bonding material 59, the fourth bonding material 80, and the fifth bonding material 69 are formed. Thus, the semiconductor device 100 of the embodiment is obtained. The manufacturing method of the semiconductor device 100 of the embodiment are not limited to those described above.

Next, the operation and effects of semiconductor device of the embodiment will be described.

FIG. 4 is a schematic sectional view of a semiconductor device 1000 as a first comparative embodiment of the embodiment. The semiconductor chip 10 does not include the protrusion 11d. Further, in the semiconductor device 1000, the slope 30 is not provided.

Figure 5:
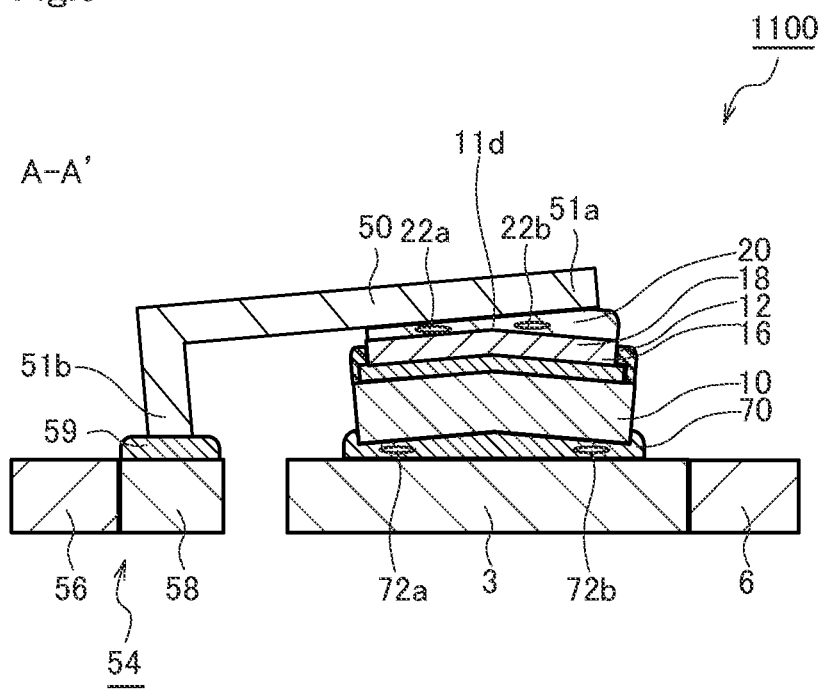
FIG. 5 is a schematic sectional view of a semiconductor device as a second comparative embodiment of the embodiment.

FIG. 5 is a schematic sectional view of a semiconductor device 1100 as a second comparative embodiment of the embodiment. The semiconductor chip 10 has the protrusion 11d. Further, in the semiconductor device 1100, the slope 30 is not provided.

It is preferable to reduce the film thickness of the semiconductor chip. For example, if the semiconductor chip is provided with a vertical MOSFET, it is preferable that the film thickness of the semiconductor chip is thin in order to reduce the on-resistance of MOSFET. However, in this case, the film thickness of the drain electrode provided on the bottom surface of the semiconductor chip and the film thickness of the source electrode provided on the upper surface of the semiconductor chip becomes relatively thick. Therefore, the semiconductor chip becomes susceptible to the effects of the stress of the drain electrode and the source electrode. In particular, the semiconductor chip often warps upwards convexly. Therefore, how to connect the connectors to such semiconductor chip has become an issue.

In addition, during the production of the semiconductor device, the cream solder is melted and solidified by vacuum-reflow heat treatment. Here, when the cream solder melts, bubbles (void) may enter the inside of the cream solder. The part with such void is more thermally resistive than the part of the surrounding bonding material. Therefore, how to remove the void has become an issue.

Since the third connector 54 is provided, evacuation conductance between the semiconductor chip 10 and the third connector 54 is reduced in the vacuum-reflow, and the void 22a of the second bonding material 20 near the third connector 54 is hardly pulled out. In particular, when the semiconductor chip 10 has a protrusion 11d, the gap between the semiconductor chip 10 and the second connector 50 in the side close to the third connector 54 is narrowed. Thus, the void is hardly pulled out further.

Further, when the semiconductor chip 10 has the protrusion 11d, compared with the case when the semiconductor chip 10 does not have the protrusion 11d, the film thickness of the first bonding material 70 and the film thickness of the second bonding material 20 become uneven. As described above, when the thickness of the bonding material is uneven, the bonding material is easily cracked due to thermal cycling applied to the semiconductor device 100 due to heating and cooling of the semiconductor device 100.

Therefore, in the semiconductor device 100, the drain connector 2 whose plate thickness of the first plate portion 3a of first plate 3 is thinner than the plate thickness of the second plate portion 3b provided between the first plate portion 3a and the drain connector 6 is used. Thus, it is possible to equalize the gap between the semiconductor chip 10 and the second connector 50 more. Therefore, when performing vacuum-reflow, the void formed in the second bonding material 20 is likely to come off.

Further, since the heat capacity of the first plate portion 3a is smaller than the heat capacity of the second plate portion 3b, the second bonding material 20 provided on the side of the first plate portion 3a is melted earlier than the second bonding material 20 provided on the side of the second plate portion 3b. This makes it difficult to form the void on the side of the first plate portion 3a of the second bonding material 20, that is, on the side close to the third connector 54.

In addition, variations in the thickness of the second bonding material 20 can be reduced, and the thickness of the second bonding material 20 can be made more uniform. Therefore, cracks in the second bonding material 20 hardly enter.

The slope 30 can be easily and accurately formed using a mold. Further, the slope 30 can hold the semiconductor chip stably via the first bonding material 70. Therefore, the slope 30 is preferably used in the semiconductor device 100 of the embodiment.

The area of the slope 30 when viewed from above is preferably larger than the area of the semiconductor chip 10 when viewed from above. This is because it is possible to hold the semiconductor chip 10 stably when the area of the slope 30 is larger.

The angle θ between the second upper surface 32 and the first upper surface 4 is preferably 0.2 degrees or more and 3 degrees or less. If θ is less than 0.2 degrees, since the gap between the semiconductor chip 10 and the second connector 50 is not sufficiently uniform, the void 22 formed within the second bonding material 20 is hardly pulled out. On the other hand, if θ is greater than 3 degrees, the film thickness of the second bonding material 20 closer to the drain terminal 6 becomes too thin, and it is difficult to pull out the void 22.

The diameter of the void 22 is preferably 1 mm or less, in order to reduce the thermal resistance of semiconductor device 100 as much as possible.

Figure 6:
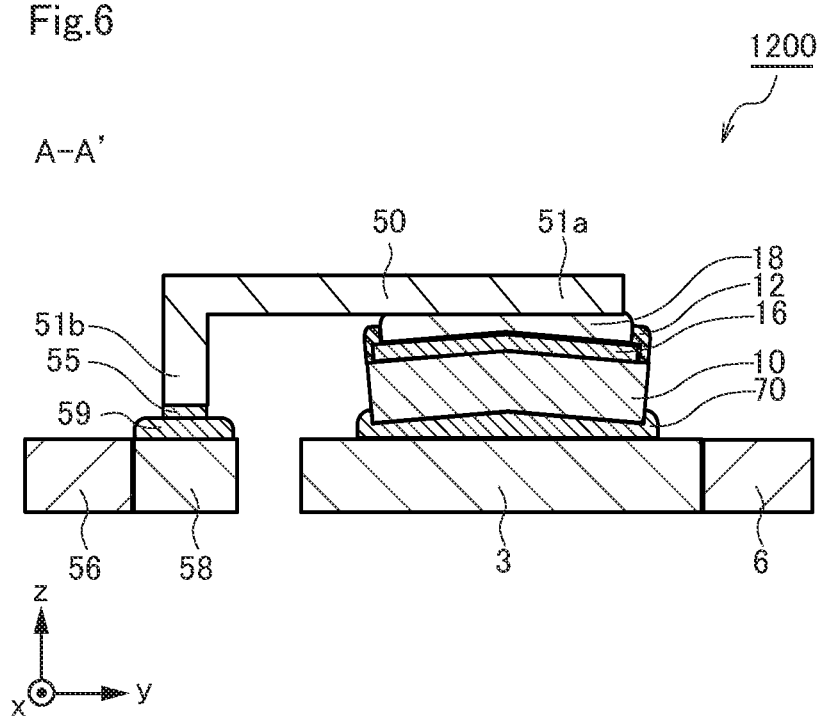
FIG. 6 is a schematic sectional view of a semiconductor device as a third comparative embodiment of the embodiment.

FIG. 6 is a schematic cross-sectional view of a semiconductor device 1200 as a third comparative embodiment of the embodiment. It is considered to make the thickness of the second bonding material 20 more uniform by connecting the connector extension 55 to the second end 51b. However, the cross-sectional area of the connector extension 55 in a plane parallel to the XY plane is small. Therefore, as in the semiconductor device 100 of the embodiment, it is preferable that the plate thickness of the first plate portion 3a of the first plate 3 is thinner than the plate thickness of the second plate portion 3b of the first plate 3 provided between the first plate portion 3a and the drain terminal 6. This is because it is possible to ensure a larger cross-sectional area by using such drain connector 2. Further, it is possible to improve the contact with the semiconductor chip 10. Therefore, it is possible to reduce the thermal resistance of the semiconductor device.

According to the semiconductor device of the embodiment, it is possible to provide a semiconductor device having high reliability.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first connector including a first plate having a first lower surface and a first upper surface and a first terminal connected to the first plate, the first plate including a second plate and a third plate, a plate thickness of the second plate being thinner than a plate thickness of the third plate, the third plate being provided between the second plate and the first terminal;
   a semiconductor chip provided on the first upper surface, the semiconductor chip having a second lower surface facing the first upper surface, a first distance between the first lower surface of the second plate and the second lower surface being shorter than a second distance between the first lower surface of the third plate and the second lower surface;
   a first bonding material provided between the first upper surface and the semiconductor chip;
   a second connector provided on the semiconductor chip,
   a third connector, the first plate being provided between the first terminal and the third connector;
   a second bonding material provided between the second connector and the semiconductor chip; and
   a third bonding material provided between the second connector and the third connector.

2. The semiconductor device according to claim 1, wherein the semiconductor chip has a convex shape on the side where the second connector is provided.

3. The semiconductor device according to claim 1, wherein the first upper surface has a slope on the first upper surface, and the slope is lowered from the third plate toward the second plate.

4. The semiconductor device according to claim 3, wherein an area of the slope when viewed from above is larger than an area of the semiconductor chip when viewed from above.

5. The semiconductor device according to claim 3, wherein an angle formed by the second upper surface of the slope and the first upper surface is preferably 0.2 degrees or more and 3 degrees or less.

6. The semiconductor device according to claim 1, wherein the second bonding material has a void.

7. The semiconductor device according to claim 6, wherein a diameter of the void is 1 mm or less.

8. The semiconductor device according to claim 1,
   wherein a third upper surface of the semiconductor chip has a first side and a second side facing the first side,
   wherein, when viewed from above, the first side is provided between the second side and the third connector, and
   wherein a thickness of the second bonding material in the vicinity of the first side is thinner than a thickness of the second bonding material in the vicinity of the second side.

9. The semiconductor device according to claim 1,
   wherein a third upper surface of the semiconductor chip has a first side and a second side facing the first side,
   wherein, when viewed from above, the first side is provided between the second side and the third connector, and
   wherein a thickness of the second bonding material in the vicinity of the first side is thicker than a thickness of the second bonding material in the vicinity of the second side.

10. A semiconductor device, comprising:
    a first connector including a first plate having a first upper surface and a first terminal connected to the first plate, the first plate including a second plate and a third plate, a plate thickness of the second plate being thinner than a plate thickness of the third plate, the third plate being provided between the second plate and the first terminal;
    a semiconductor chip provided on the first upper surface;
    a first bonding material provided between the first upper surface and the semiconductor chip;
    a second connector provided on the semiconductor chip,
    a third connector, the first plate being provided between the first terminal and the third connector;
    a second bonding material provided between the second connector and the semiconductor chip; and
    a third bonding material provided between the second connector and the third connector,
    wherein the semiconductor chip has a convex shape on the side where the second connector is provided,
    wherein the second bonding material has a void, and
    wherein the void is located closer to an edge of the semiconductor chip than an apex of the convex shape.

11. The semiconductor device according to claim 10, wherein the first upper surface has a slope on the first upper surface, and the slope is lowered from the third plate toward the second plate.

12. The semiconductor device according to claim 11, wherein an area of the slope when viewed from above is larger than an area of the semiconductor chip when viewed from above.

13. The semiconductor device according to claim 11, wherein an angle formed by the second upper surface of the slope and the first upper surface is preferably 0.2 degrees or more and 3 degrees or less.

14. The semiconductor device according to claim 10, wherein a diameter of the void is 1 mm or less.

15. The semiconductor device according to claim 10,
    wherein a third upper surface of the semiconductor chip has a first side and a second side facing the first side,
    wherein, when viewed from above, the first side is provided between the second side and the third connector, and
    wherein a thickness of the second bonding material in the vicinity of the first side is thinner than a thickness of the second bonding material in the vicinity of the second side.

16. The semiconductor device according to claim 10,
wherein a third upper surface of the semiconductor chip has a first side and a second side facing the first side,
wherein, when viewed from above, the first side is provided between the second side and the third connector, and
wherein a thickness of the second bonding material in the vicinity of the first side is thicker than a thickness of the second bonding material in the vicinity of the second side.

17. The semiconductor device according to claim 10,
wherein the first plate has a first lower surface,
wherein the semiconductor chip has a second lower surface facing the first upper surface, and
wherein a first distance between the first lower surface of the second plate and the second lower surface is shorter than a second distance between the first lower surface of the third plate and the second lower surface.

\* \* \* \* \*